United States Patent
Kojima

(10) Patent No.: US 8,247,925 B2
(45) Date of Patent: Aug. 21, 2012

(54) POWER SOURCE STABILIZATION CIRCUIT, ELECTRONIC DEVICE AND TESTING APPARATUS

(75) Inventor: Shoji Kojima, Gunma (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/700,705

(22) Filed: Feb. 4, 2010

(65) Prior Publication Data
US 2010/0194404 A1    Aug. 5, 2010

Related U.S. Application Data

(63) Continuation of application No. PCT/JP2008/064759, filed on Aug. 19, 2008.

(30) Foreign Application Priority Data

Sep. 4, 2007    (JP) .................................. 2007-229463

(51) Int. Cl.
  *H03G 3/20* (2006.01)
(52) U.S. Cl. ....................................... 307/102; 307/103
(58) Field of Classification Search .................. 307/102, 307/103; 327/535, 538
See application file for complete search history.

(56) References Cited

U.S. PATENT DOCUMENTS

| | | | | |
|---|---|---|---|---|
| 5,594,359 | A | | 1/1997 | Hashimoto |
| 5,825,238 | A | * | 10/1998 | Poimboeuf et al. ............ 327/552 |
| 5,861,771 | A | * | 1/1999 | Matsuda et al. .............. 327/540 |
| 6,509,783 | B2 | * | 1/2003 | Chowdhury ................... 327/513 |
| 7,038,529 | B2 | * | 5/2006 | Ozeki et al. ................... 327/538 |
| 7,113,027 | B2 | * | 9/2006 | Yamazaki et al. ............. 327/541 |
| 7,119,604 | B2 | * | 10/2006 | Chih ............................. 327/534 |
| 7,313,048 | B2 | * | 12/2007 | Ishikawa et al. .............. 365/226 |
| 7,352,626 | B1 | * | 4/2008 | Wu et al. .................. 365/185.18 |
| 7,656,181 | B2 | | 2/2010 | Kim et al. |
| 2005/0146378 | A1 | | 7/2005 | Ozeki et al. |
| 2007/0018637 | A1 | | 1/2007 | Kim et al. |

FOREIGN PATENT DOCUMENTS

| | | |
|---|---|---|
| JP | 07-333249 A | 12/1995 |
| JP | 10-135336 A | 5/1998 |
| JP | 2007-033451 A | 2/2007 |
| JP | 2007-195310 A | 8/2007 |
| WO | 2004/034169 A1 | 4/2004 |

OTHER PUBLICATIONS

Korean Office Action in counterpart application KR 10-2010-7005033, dated May 23, 2011.
International Search Report (ISR) issued in PCT/JP2008/064759(parent application) for Examiner consideration.
Written Opinion (PCT/ISA/237) issued in PCT/JP2008/064759 (parent application).

* cited by examiner

*Primary Examiner* — Fritz M Fleming
(74) *Attorney, Agent, or Firm* — Chen Yoshimura LLP

(57) ABSTRACT

A power source stabilization circuit provided within a chip of an electronic device is provided. The power source stabilization circuit stabilizes a power source voltage supplied to an operational circuit of the electronic device. The power source stabilization circuit includes an amplifier that detects a fluctuation component in the power source voltage occurring in a main power source wiring used to supply the power source voltage to the operational circuit, amplifies the detected fluctuation component, and outputs the amplified fluctuation component, and a stabilization capacitor that is provided between an output end of the amplifier and the main power source wiring and supplies to the main power source wiring a current to reduce fluctuation in the power source voltage occurring in the main power source wiring, in accordance with the output from the amplifier.

10 Claims, 7 Drawing Sheets

POWER SOURCE STABILIZATION CIRCUIT, ELECTRONIC DEVICE AND TESTING APPARATUS

This is a continuation application of PCT/JP2008/064759 filed on Aug. 19, 2008.

BACKGROUND

1. Technical Field

The present invention relates to a power source stabilization circuit, an electronic device, and a testing apparatus.

2. Related Art

It is known in the art to stabilize a power source voltage that is supplied to an operational circuit of an electronic device such as a semiconductor circuit by connecting a pass capacitor to a power source wiring that inputs the power to the electronic device (for example, see Patent Document 1). Generally, the pass capacitor is provided outside the chip of the electronic device and located between the ground potential and the power source wiring.

Patent Document 1: Japanese Patent Application Publication No. 07-333249

Accordingly, the fluctuation in the current flowing through the power source wiring is reduced by supplying to the electronic device via the power input terminal a current determined by the fluctuation in the current consumed by the electronic device. In this manner, the fluctuation in the power source voltage caused by the fluctuation in the current can be reduced. The pass capacitor used commonly has a capacitance of approximately several dozen nF to several µF.

However, the power source voltage may fluctuate while traveling the wiring from the power input terminal of the electronic device to the operational circuit due to the fluctuation in the current consumed by the operational circuit. Such a fluctuation in the power source voltage cannot be compensated for by means of the above-described pass capacitor, which is provided outside the chip of the electronic device.

To address this issue, a similar pass capacitor may be additionally provided within the chip of the electronic device. Such a capacitor inside the chip of the electronic device may be formed by using the gate capacitance of a transistor. Here, a single transistor only has a gate capacitance of approximately several fF. Therefore, an enormous number of elements needs to be formed to form the above-mentioned pass capacitor within the chip.

SUMMARY

Therefore, it is an object of an aspect of the innovations herein to provide a power source stabilization circuit, an electronic device, and a testing apparatus which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary circuit may include a power source stabilization circuit provided within a chip of an electronic device. The power source stabilization circuit stabilizes a power source voltage supplied to an operational circuit of the electronic device. The power source stabilization circuit includes an amplifier that detects a fluctuation component in the power source voltage occurring in a main power source wiring used to supply the power source voltage to the operational circuit, amplifies the detected fluctuation component, and outputs the amplified fluctuation component, and a stabilization capacitor that is provided between an output end of the amplifier and the main power source wiring and supplies to the main power source wiring a current to reduce fluctuation in the power source voltage occurring in the main power source wiring, in accordance with the output from the amplifier.

According to an aspect related to the innovations herein, one exemplary device may include an electronic device including an operational circuit and a power source stabilization circuit that is provided in a same chip as the operational circuit. The power source stabilization circuit is adapted to stabilize a power source voltage supplied to the operational circuit. Here, the power source stabilization circuit includes an amplifier that detects a fluctuation component in the power source voltage occurring in a main power source wiring used to supply the power source voltage to the operational circuit, amplifies the detected fluctuation component, and outputs the amplified fluctuation component, and a stabilization capacitor that is provided between an output end of the amplifier and the main power source wiring and supplies to the main power source wiring a current to reduce fluctuation in the power source voltage occurring in the main power source wiring, in accordance with the output from the amplifier.

According to an aspect related to the innovations herein, one exemplary apparatus may include a testing apparatus for testing a device under test. The testing apparatus includes a signal input section that generates a predetermined test signal and inputs the generated test signal into the device under test, and a judging section that judges whether the device under test is acceptable based on a signal under measurement that is output from the device under test in response to the test signal. Here, the signal input section includes an operational circuit that operates to generate the test signal, and a power source stabilization circuit that is provided in a same chip as the operational circuit, the power source stabilization circuit stabilizing a power source voltage supplied to the operational circuit. Furthermore, the power source stabilization circuit includes an amplifier that detects a fluctuation component in the power source voltage occurring in a main power source wiring used to supply the power source voltage to the operational circuit, amplifies the detected fluctuation component, and outputs the amplified fluctuation component, and a stabilization capacitor that is provided between an output end of the amplifier and the main power source wiring and supplies to the main power source wiring a current to reduce fluctuation in the power source voltage occurring in the main power source wiring, in accordance with the output from the amplifier.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
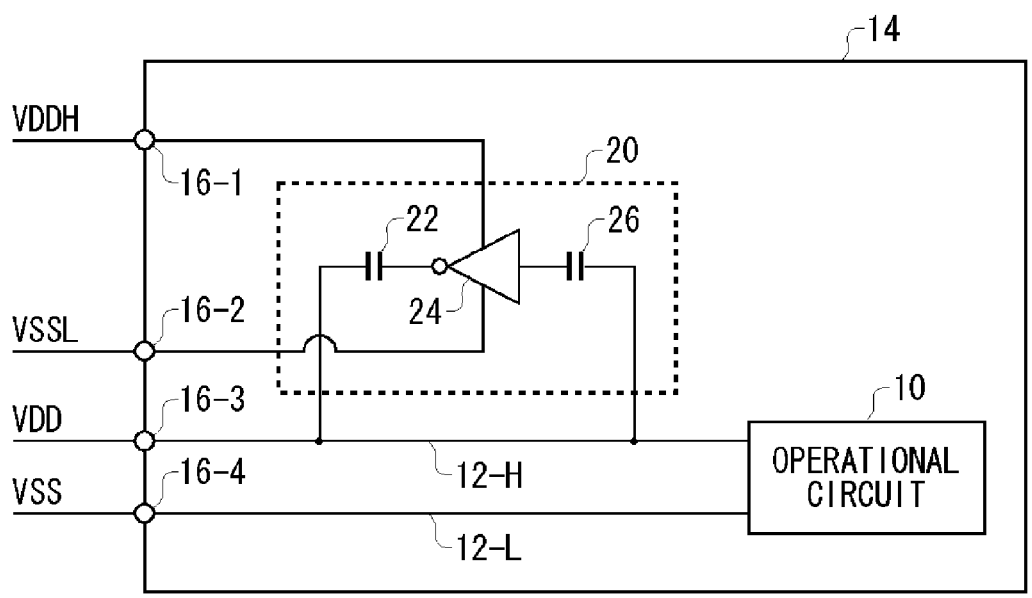
FIG. 1 illustrates an exemplary configuration of an electronic device 100 relating to an embodiment of the present invention.

FIG. 1 illustrates an exemplary configuration of an electronic device 100 relating to an embodiment of the present invention. The electronic device 100 may be a semiconductor chip, for example. The electronic device 100 includes an operational circuit 10, a package 14, a power source stabilization circuit 20, a main power source wiring 12 (including a high-voltage power source wiring 12-H and a low-voltage power source wiring 12-L), and a plurality of power source terminals 16 (16-1 to 16-4).

The package 14 houses therein the operational circuit 10, the power source stabilization circuit 20, and the main power source wiring 12. The operational circuit 10, the power source stabilization circuit 20, and the main power source wiring 12 are formed on a semiconductor substrate, and the package 14 may be made of a resin, ceramic, or any other suitable materials and formed so as to encapsulate the semiconductor substrate. On the surface of the package 14, terminals are provided to transfer power, signals and the like between the inside and the outside of the chip of the electronic device 100. The package 14 may have signal terminals provided thereon to send/receive signals to/from the operational circuit 10, in addition to the power source terminals 16 shown in FIG. 1.

The operational circuit 10 operates in accordance with a power source voltage and signals supplied thereto. The operational circuit 10 may be a memory circuit, a digital circuit, an analog circuit, or a combination thereof. The main power source wiring 12 supplies to the operational circuit 10 a power source voltage VDD and a power source voltage VSS, which are supplied through the power source terminals 16-3 and 16-4.

The power source stabilization circuit 20 is provided within the same chip as the operational circuit 10 in order to stabilize the power source voltage supplied to the operational circuit 10. The power source stabilization circuit 20 may detect fluctuation in the power source voltage traveling through the main power source wiring 12 at a location in the vicinity of the operational circuit 10, and supply to the main power source wiring 12 a current determined by the detected fluctuation in the power source voltage.

The power source stabilization circuit 20 is constituted by an AC-coupled capacitor 26, an amplifier 24, and a stabilization capacitor 22. The AC-coupled capacitor 26 detects the fluctuation in the power source voltage supplied to the operational circuit 10. According to the present example, the AC-coupled capacitor 26 is connected at one end thereof to the high-voltage power source wiring 12-H at a location in the vicinity of the operational circuit 10 and connected at the other end thereof to the input terminal of the amplifier 24. In this manner, the AC-coupled capacitor 26 can input the alternating current (AC) component (the fluctuation component) of the power source voltage supplied to the operational circuit 10 into the amplifier 24.

The amplifier 24 detects the fluctuation component of the power source voltage in the main power source wiring 12, which is designed to supply the power source voltage to the operational circuit 10, amplifies the detected fluctuation component, and outputs the result. According to the present example, the amplifier 24 detects the fluctuation component of the power source voltage through the AC-coupled capacitor 26. Here, the amplifier 24 relating to the present example may be an inverting amplifier that is designed to invert and amplify the fluctuation component of the power source voltage with a predetermined amplification ratio.

The amplifier 24 receives power source voltages VDDH and VSSL via wirings different than the main power source wiring 12, from the power source terminals 16-1 and 16-2. The power source voltages VDDH and VSSL are preferably supplied from a power source system that is different than the power source system that supplies the power source voltages VDD and VSS. The values of the power source voltages VDDH and VSSL may be approximately equal to the result of multiplying the fluctuation components in the power source voltages VDD and VSS input into the operational circuit 10 by the expected amplification ratio of the amplifier 24.

The stabilization capacitor 22 is provided between the output end of the amplifier 24 and the main power source wiring 12, and supplies to the main power source wiring 12 a current adjusted to reduce the fluctuation in the power source voltage in the main power source wiring 12 in accordance with the output of the amplifier 24. According to the present example, the stabilization capacitor 22 is connected to the high-voltage power source wiring 12-H. Since the amplifier 24 amplifies and then outputs the fluctuation component in the power source voltage supplied to the operational circuit 10, the capacitance of the stabilization capacitor 22 appears as if it is amplified with the amplification ratio of the amplifier 24 in the power source stabilization circuit 20 from the perspective of the operational circuit 10.

According to the power source stabilization circuit 20 of the present example, the stabilization capacitor 22 whose capacitance is relatively small can be used to compensate for the fluctuation in the power source voltage supplied to the operational circuit 10. Therefore, the power source stabilization circuit 20 can be easily disposed within the chip of the electronic device 100 in order to compensate for the fluctuation in the power source voltage within the chip.

Here, the capacitance of the AC-coupled capacitor 26 is preferably larger than the input capacitance of the amplifier 24. The capacitance of the AC-coupled capacitor 26 may be smaller than the capacitance of the stabilization capacitor 22. The system that applies the power source voltages to the amplifier 24 is different than the system that applies the power source voltages to the operational circuit 10 in the present example, but the same system may be used to apply power source voltages to both the amplifier 24 and the operational circuit 10 in a different example. Furthermore, the AC-coupled capacitor 26 is connected to the high-voltage power source wiring 12-H in the present example, but may be connected to the low-voltage power source wiring 12-L in a different example. If such is the case, the stabilization capacitor 22 may also be connected to the low-voltage power source wiring 12-L.

Figure 2:
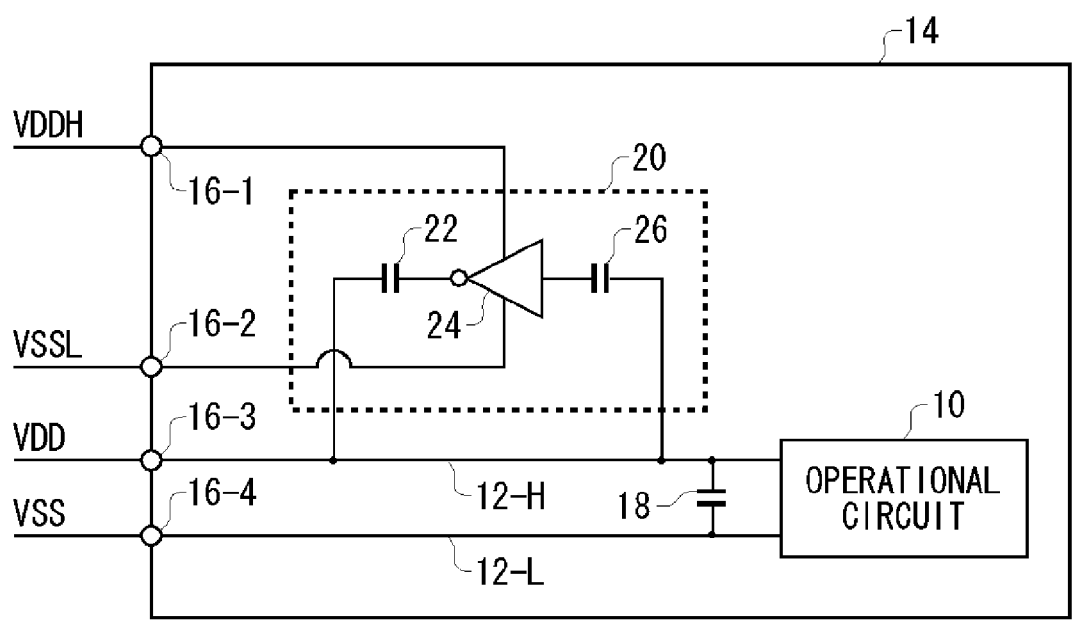
FIG. 2 illustrates another exemplary configuration of the electronic device 100.

FIG. 2 illustrates another exemplary configuration of the electronic device 100. According to the present example, the electronic device 100 includes a bypass capacitor 18 in addition to the constituents of the electronic device 100 described with reference to FIG. 1. The bypass capacitor 18 is provided between the main power source wiring 12 and a predetermined potential. In the present example, the bypass capacitor 18 is provided between the high-voltage power source wiring 12-H and the low-voltage power source wiring 12-L. The bypass capacitor 18 is preferably located in the vicinity of the operational circuit 10.

The bypass capacitor 18 supplies to the main power source wiring 12 a current determined by the fluctuation in the power source voltage in the main power source wiring 12. The bypass capacitor 18 preferably follows the fluctuation in the power source voltage faster than the amplifier 24. The amplifier 24 is formed by a transistor and the like, which operate with a certain delay. While the transistor and the like are being delayed, the stabilization capacitor 22 may not be capable of compensating for the fluctuation in the power source voltage in the main power source wiring 12. The bypass capacitor 18 thus compensates for the fluctuation in the power source voltage while the transistor and the like are being delayed.

More specifically, the time constant of the bypass capacitor 18 is preferably smaller than the time constant of the amplifier 24. Stated differently, the bypass capacitor 18 is preferably configured to have such a capacitance that the time constant of the bypass capacitor 18 becomes smaller than the time constant of the amplifier 24. With the above-described configuration, the electronic device 100 can compensate for the fluctuation in the power source voltage more accurately.

Figure 3:
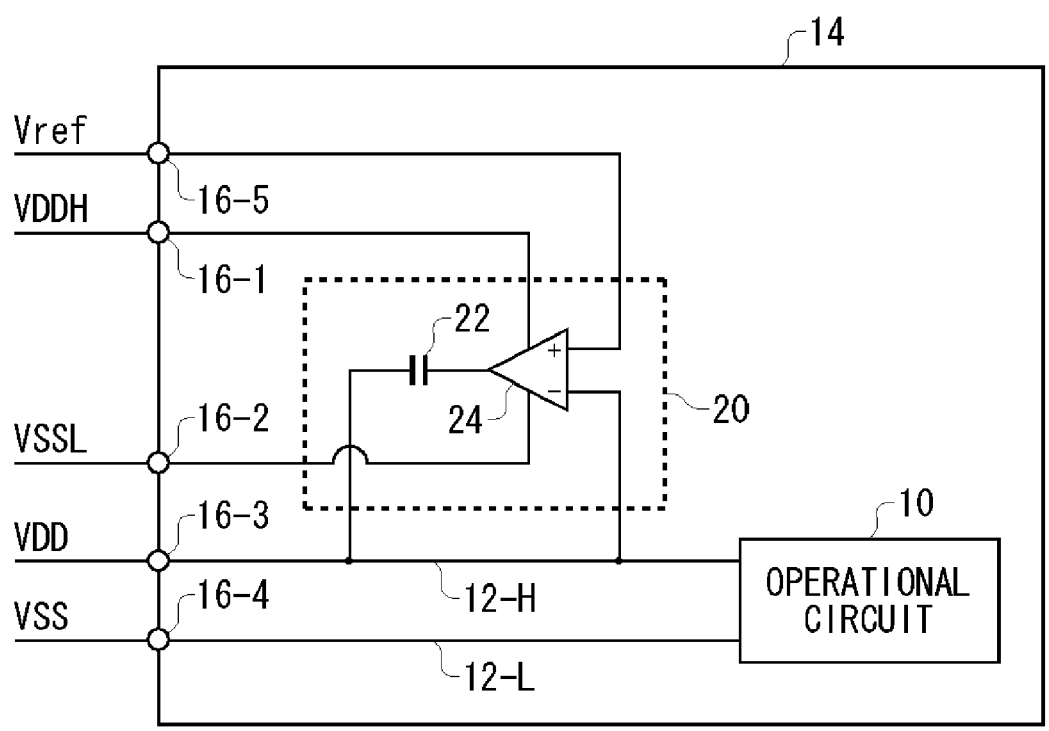
FIG. 3 illustrates another exemplary configuration of a power source stabilization circuit 20.

FIG. 3 illustrates another exemplary configuration of the power source stabilization circuit 20. According to the present example, the power source stabilization circuit 20 includes the amplifier 24 and the stabilization capacitor 22. The stabilization capacitor 22 may be the same as the stabilization capacitor 22 described with reference to FIG. 1. The amplifier 24 relating to the present example is a differential amplifier.

One of the input terminals of the amplifier 24 (in the present example, the negative input terminal) is connected to the main power source wiring 12 (in the present example, the high-voltage power source wiring 12-H), and the other of the input terminals of the amplifier 24 (in the present example, the positive input terminal) receives a predetermined reference potential Vref. The input terminal of the amplifier 24 may be connected to the main power source wiring 12 at a location in the vicinity of the operational circuit 10. The package 14 may further have a power source terminal 16-5 thereon that receives the reference potential Vref from an external source. In a different example, the power source voltage VDD received by the power source terminal 16-3 may be input into the amplifier 24 as the reference potential Vref.

With the above-described configuration, the electronic device 100 can also compensate for the fluctuation in the power source voltage that occurs within the chip of the electronic device 100. Also, the power source stabilization circuit 20 relating to the present example can be realized without the AC-coupled capacitor 26. The power source stabilization circuit 20 relating to the present example can be applied to either of the electronic devices 100 described with reference to FIGS. 1 and 2.

Figure 4:
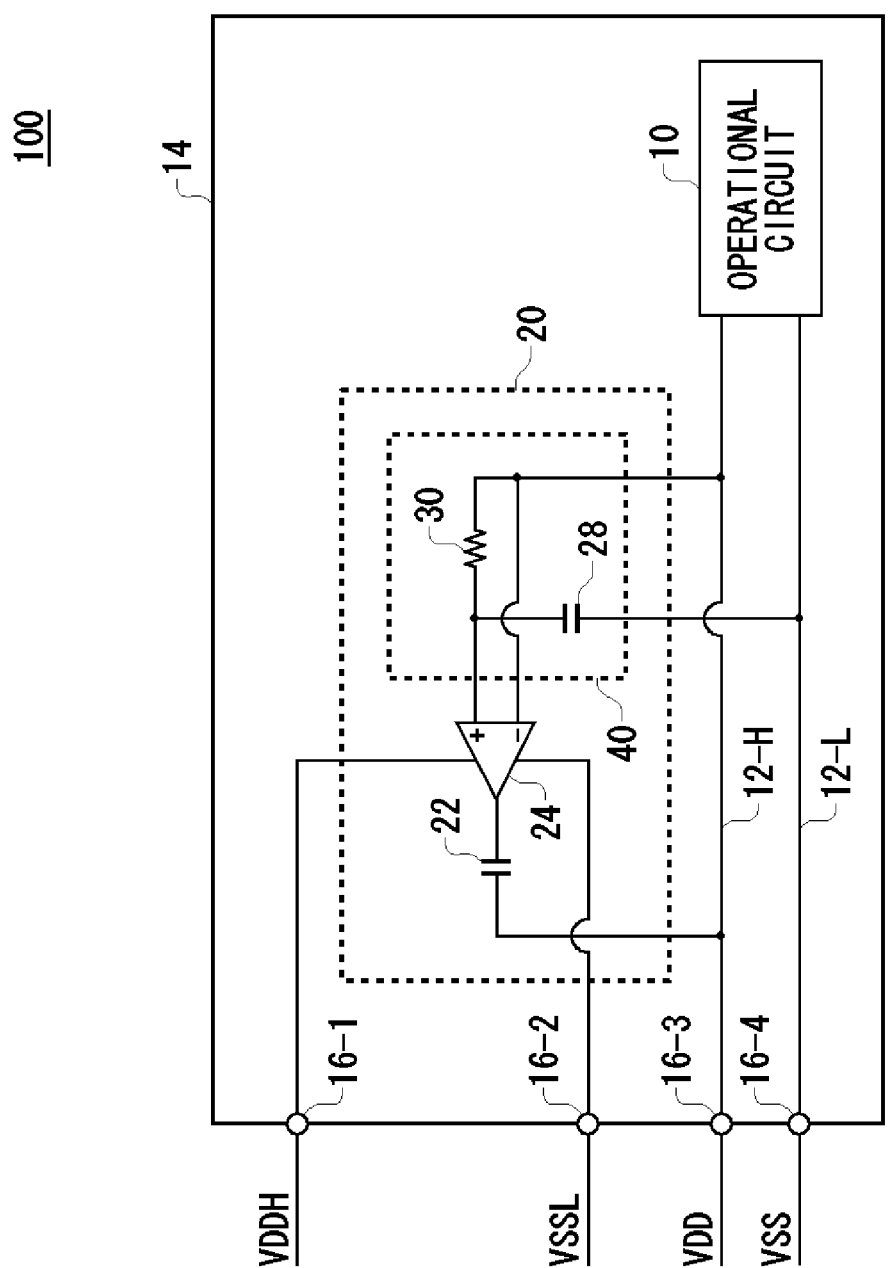
FIG. 4 illustrates yet another exemplary configuration of the power source stabilization circuit 20.

FIG. 4 illustrates yet another exemplary configuration of the power source stabilization circuit 20. According to the present example, the power source stabilization circuit 20 includes the stabilization capacitor 22, the amplifier 24, and a reference potential generating section 40. The stabilization capacitor 22 and the amplifier 24 relating to the present example may be the same as the stabilization capacitor 22 and the amplifier 24 described with reference to FIG. 3. The amplifier 24 relating to the present example is a differential amplifier.

The reference potential generating section 40 generates a reference potential Vref to be supplied to the amplifier 24. Therefore, the electronic device 100 relating to the present example may not need the power source terminal 16-5, which is described with reference to FIG. 3. The reference potential generating section 40 includes a resistance 30 and a capacitor 28.

The resistance 30 is provided between the positive input terminal of the amplifier 24 and the high-voltage power source wiring 12-H. The capacitor 28 is provided between the positive input terminal of the amplifier 24 and the low-voltage power source wiring 12-L. With such a configuration, the reference potential generating section 40 can generate the reference potential Vref with it being possible to eliminate the fluctuation component of the difference between the power source voltage VDD traveling through the high-voltage power source wiring 12-H and the power source voltage VSS traveling through the low-voltage power source wiring 12-L.

With the above-described configuration, the electronic device 100 can also compensate for the fluctuation in the power source voltage that occurs within the chip of the electronic device 100. According to the present example, since the power source stabilization circuit 20 generates the reference potential Vref within the electronic device 100, the reference potential Vref can be prevented from fluctuating during the passage through the package 14. The power source stabilization circuit 20 relating to the present example can be applied to either of the electronic devices 100 described with reference to FIGS. 1 and 2.

Figure 5:
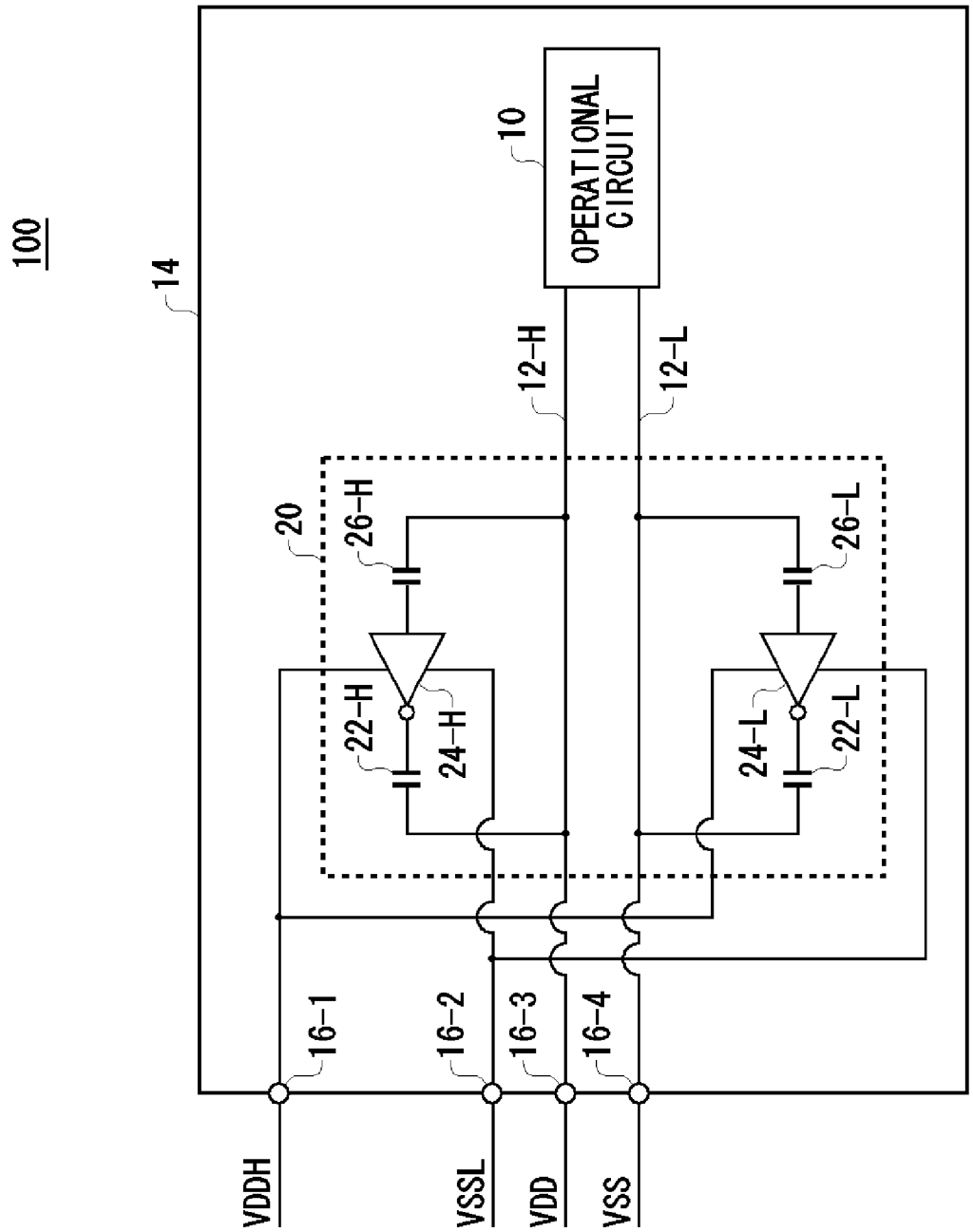
FIG. 5 illustrates still another exemplary configuration of the power source stabilization circuit 20.

FIG. 5 illustrates still another exemplary configuration of the power source stabilization circuit 20. According to the present example, the power source stabilization circuit 20 includes a high-voltage stabilization capacitor 22-H, a high-voltage amplifier 24-H, a high-voltage AC-coupled capacitor 26-H, a low-voltage stabilization capacitor 22-L, a low-voltage amplifier 24-L, and a low-voltage AC-coupled capacitor 26-L.

The high-voltage stabilization capacitor 22-H and the low-voltage stabilization capacitor 22-L may have the same characteristics as each other. The high-voltage stabilization capacitor 22-H and the low-voltage stabilization capacitor 22-L may have the same characteristics as the stabilization capacitor 22 described with reference to FIG. 1.

The high-voltage amplifier 24-H and the low-voltage amplifier 24-L may have the same characteristics as each other. The high-voltage amplifier 24-H and the low-voltage amplifier 24-L may have the same characteristics as the amplifier 24 described with reference to FIG. 1.

The high-voltage AC-coupled capacitor 26-H and the low-voltage AC-coupled capacitor 26-L may have the same characteristics as each other. The high-voltage AC-coupled capacitor 26-H and the low-voltage AC-coupled capacitor 26-L may have the same characteristics as the AC-coupled capacitor 26 described with reference to FIG. 1.

The high-voltage AC-coupled capacitor 26-H detects the fluctuation in the power source voltage traveling through the high-voltage power source wiring 12-H. Similarly, the low-voltage AC-coupled capacitor 26-L detects the fluctuation in the power source voltage traveling through the low-voltage power source wiring 12-L.

The high-voltage amplifier 24-H detects the fluctuation component in the power source voltage traveling through the high-voltage power source wiring 12-H, via the high-voltage AC-coupled capacitor 26-H. Similarly, the low-voltage amplifier 24-L detects the fluctuation component in the power source voltage traveling through the low-voltage power source wiring 12-L, via the low-voltage AC-coupled capacitor 26-L. The high-voltage amplifier 24-H and the low-voltage amplifier 24-L may both receive the power source voltage VDDH and the power source voltage VSSL from the power source terminals 16-1 and 16-2 shared therebetween.

The high-voltage stabilization capacitor 22-H is provided between the output end of the high-voltage amplifier 24-H and the high-voltage power source wiring 12-H and supplies to the high-voltage power source wiring 12-H a current adjusted to reduce the fluctuation in the power source voltage in the high-voltage power source wiring 12-H, in accordance with the output from the high-voltage amplifier 24-H. Similarly, the low-voltage stabilization capacitor 22-L is provided between the output end of the low-voltage amplifier 24-L and the low-voltage power source wiring 12-L and supplies to the low-voltage power source wiring 12-L a current adjusted to reduce the fluctuation in the power source voltage in the low-voltage power source wiring 12-L, in accordance with the output from the low-voltage amplifier 24-L.

With the above-described configuration, the electronic device 100 can stabilize the respective power source voltages supplied via the high-voltage power source wiring 12-H and the low-voltage power source wiring 12-L. The power source stabilization circuit 20 relating to the present example can be applied to either of the electronic devices 100 described with reference to FIGS. 1 and 2. In the electronic device 100 relating to the present example, a bypass capacitor 18 may be provided between the ground potential and the high-voltage power source wiring 12-H and another bypass capacitor 18 may be provided between the ground potential and the low-voltage power source wiring 12-L.

Figure 6:
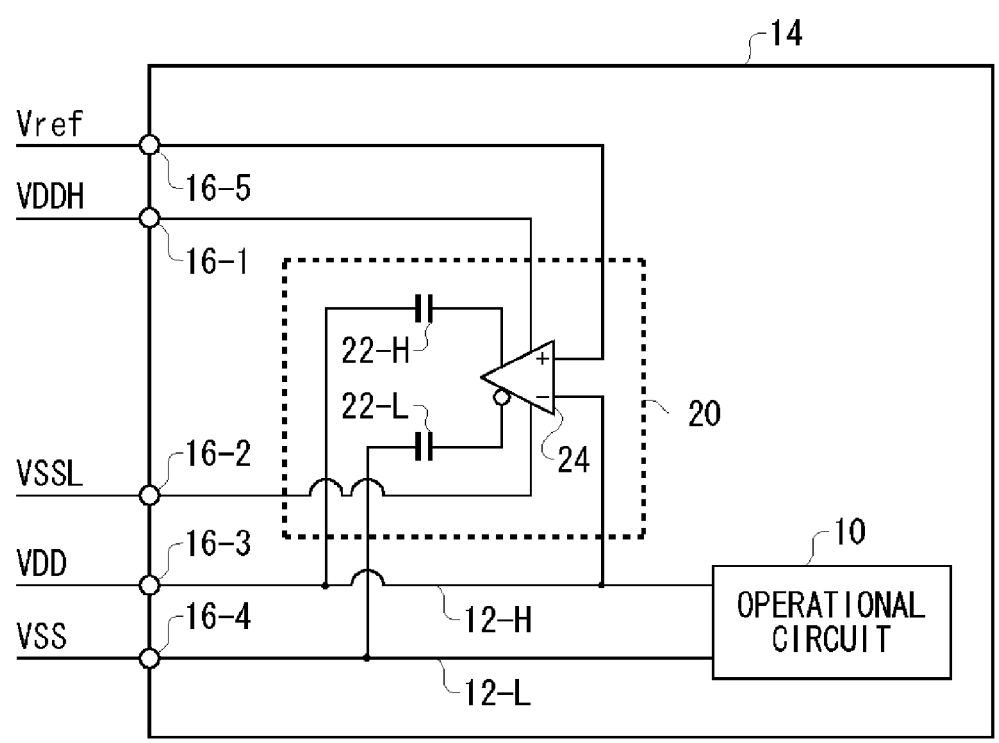
FIG. 6 illustrates yet another exemplary configuration of the power source stabilization circuit 20.

FIG. 6 illustrates yet another exemplary configuration of the power source stabilization circuit 20. According to the present example, the power source stabilization circuit 20 includes the high-voltage stabilization capacitor 22-H, the low-voltage stabilization capacitor 22-L, and the amplifier 24. The amplifier 24 relating to the present example is a differential amplifier similarly to the examples described with reference to FIGS. 3 and 4. The reference potential Vref to be supplied to the amplifier 24 may be generated in either of the manners described with reference to FIGS. 3 and 4.

The high-voltage stabilization capacitor 22-H and the low-voltage stabilization capacitor 22-L may have the same characteristics as each other. The high-voltage stabilization capacitor 22-H and the low-voltage stabilization capacitor 22-L may have the same characteristics as the stabilization capacitor 22 described with reference to FIG. 1.

The high-voltage stabilization capacitor 22-H is provided between the high-voltage power source wiring 12-H and one of the positive and negative output ends (in the present example, the positive output end) of the amplifier 24. The low-voltage stabilization capacitor 22-L is provided between the low-voltage power source wiring 12-L and the other of the positive and negative output ends (in the present example, the negative output end) of the amplifier 24.

With the above-described simple configuration, the electronic device 100 can also stabilize the respective power source voltages supplied via the high-voltage power source wiring 12-H and the low-voltage power source wiring 12-L. The electronic device 100 relating to the present example may additionally include bypass capacitors 18 similarly to the example described with reference to FIG. 5.

Figure 7:
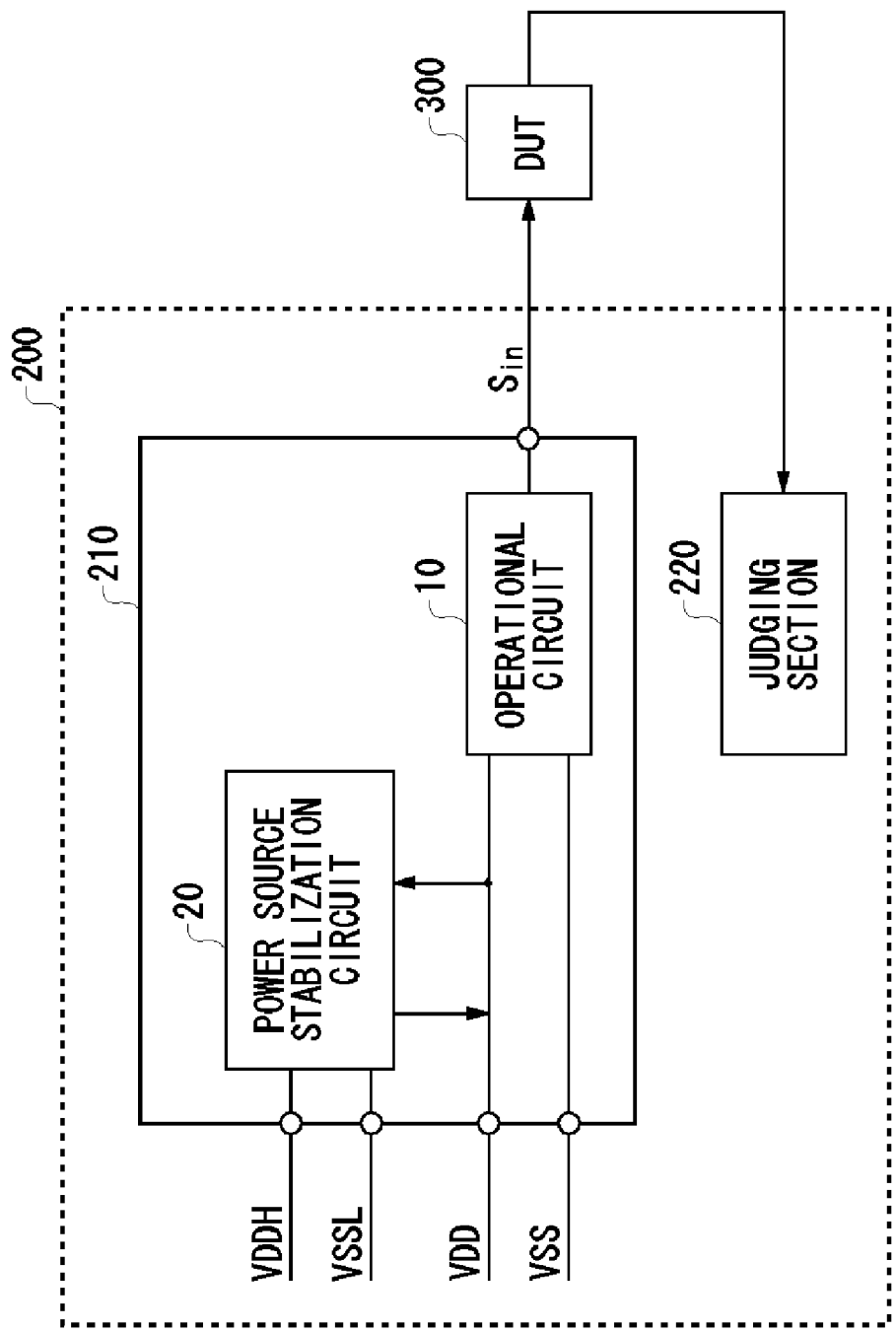
FIG. 7 illustrates an exemplary configuration of a testing apparatus 200.

FIG. 7 illustrates an exemplary configuration of a testing apparatus 200. The testing apparatus 200 is designed to test a device under test 300 such as a semiconductor circuit. The testing apparatus 200 includes a signal input section 210 and a judging section 220.

The signal input section 210 generates a predetermined test signal and inputs the generated test signal into the device under test 300. The test signal may have a predetermined logic pattern to operate the logic circuit of the device under test 300. Alternatively, the test signal may be designed to designate an address in the memory of the device under test 300 and write/read data into/from the designated address of the device under test 300. As a further alternative example, the test signal may be an analog signal.

The signal input section 210 may generate the test signal by using one of the electronic devices 100 described with reference to FIGS. 1 to 6. The signal input section 210 may output the test signal from the operational circuit 10 of the electronic device 100. As described above, the electronic device 100 can stabilize the power source voltage supplied to the operational circuit 10. Therefore, the signal input section 210 can generate an accurate test signal.

The judging section 220 judges whether the device under test 300 is acceptable based on a signal under measurement that is output from the device under test 300 in response to the test signal. The judging section 220 may judge whether the device under test 300 is acceptable by judging whether the logic pattern of the signal under measurement matches a predetermined expected value pattern. Here, the testing apparatus 200 relating to the present example can generate an accurate test signal. Accordingly, the testing apparatus 200 can accurately test the device under test 300.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A power source stabilization circuit provided within a chip of an electronic device, the power source stabilization circuit stabilizing a power source voltage supplied to an operational circuit of the electronic device, the power source stabilization circuit comprising:

an amplifier that detects a fluctuation component in the power source voltage occurring in a main power source wiring used to supply the power source voltage to the operational circuit, amplifies the detected fluctuation component, and outputs the amplified fluctuation component; and a stabilization capacitor that is provided between an output end of the amplifier and the main power source wiring and supplies to the main power source wiring a current to reduce fluctuation in the power source voltage occurring in the main power source wiring, in accordance with the output from the amplifier, wherein a power source voltage supplied to the amplifier is supplied from a different power source system than the power source voltage supplied to the operational circuit, the power source voltage supplied to the amplifier is different from the power source voltage supplied to the operational circuit, and the power source voltage supplied to the amplifier is approximately equal to a result of multiplying the fluctuation component in the power source voltage supplied to the operational circuit by an expected amplification ratio of the amplifier.

2. The power source stabilization circuit as set forth in claim 1, further comprising
a bypass capacitor that is provided between the main power source wiring and a predetermined potential, the bypass capacitor supplying to the main power source wiring a current determined by the fluctuation in the power source voltage occurring in the main power source wiring.

3. The power source stabilization circuit as set forth in claim 2, wherein
a time constant of the bypass capacitor is smaller than a time constant of the amplifier.

4. The power source stabilization circuit as set forth in claim 1, further comprising
an AC-coupled capacitor that is provided between an input terminal of the amplifier and the main power source wiring, the AC-coupled capacitor inputting the fluctuation component in the power source voltage into the amplifier.

5. The power source stabilization circuit as set forth in claim 4, wherein
the amplifier is an inverting amplifier that inverts and amplifies the fluctuation component in the power source voltage input from the AC-coupled capacitor and outputs the resulting fluctuation component.

6. The power source stabilization circuit as set forth in claim 1, wherein
the amplifier is a differential amplifier, and
one of input terminals of the amplifier is connected to the main power source wiring, and the other of the input terminals of the amplifier receives a predetermined reference potential.

7. The power source stabilization circuit as set forth in claim 6, further comprising
a reference potential generating section that generates the reference potential, wherein
the main power source wiring has a high-voltage power source wiring and a low-voltage power source wiring, and
the reference potential generating section includes:
a resistance that is provided between the high-voltage power source wiring and the other input terminal of the amplifier; and
a capacitor that is provided between the low-voltage power source wiring and the other input terminal of the amplifier.

8. The power source stabilization circuit as set forth in claim 1, wherein
the main power source wiring has a high-voltage power source wiring and a low-voltage power source wiring,
the amplifier includes:
a high-voltage amplifier that amplifies a fluctuation component in a power source voltage occurring in the high-voltage power source wiring and outputs the amplified fluctuation component; and
a low-voltage amplifier that amplifies a fluctuation component in a power source voltage occurring in the low-voltage power source wiring and outputs the amplified fluctuation component, and
the stabilization capacitor includes:
a high-voltage stabilization capacitor that is provided between an output end of the high-voltage amplifier and the high-voltage power source wiring; and
a low-voltage stabilization capacitor that is provided between an output end of the low-voltage amplifier and the low-voltage power source wiring.

9. The power source stabilization circuit as set forth in claim 1, wherein
the main power source wiring has a high-voltage power source wiring and a low-voltage power source wiring,
the amplifier is a differential amplifier,
one of input terminals of the amplifier is connected to one of the high-voltage power source wiring and the low-voltage power source wiring, and the other of the input terminals of the amplifier receives a predetermined reference potential, and
the stabilization capacitor includes:
a high-voltage stabilization capacitor that is provided between (i) the high-voltage power source wiring and (ii) one of positive and negative output ends of the amplifier; and
a low-voltage stabilization capacitor that is provided between (I) the low-voltage power source wiring and (II) the other of the positive and negative output ends of the amplifier.

10. An electronic device comprising an operational circuit and a power source stabilization circuit that is provided in a same chip as the operational circuit, the power source stabilization circuit adapted to stabilize a power source voltage supplied to the operational circuit, wherein
the power source stabilization circuit includes:
an amplifier that detects a fluctuation component in the power source voltage occurring in a main power source wiring used to supply the power source voltage to the operational circuit, amplifies the detected fluctuation component, and outputs the amplified fluctuation component; and
a stabilization capacitor that is provided between an output end of the amplifier and the main power source wiring and supplies to the main power source wiring a current to reduce fluctuation in the power source voltage occurring in the main power source wiring, in accordance with the output from the amplifier, wherein
a power source voltage supplied to the amplifier is supplied from a different power source system than the power source voltage supplied to the operational circuit,
the power source voltage supplied to the amplifier is different form the power source voltage supplied to the operational circuit, and
the power source voltage supplied to the amplifier is approximately equal to a result of multiplying the fluctuation component in the power source voltage supplied to the operational circuit by an expected amplification ratio of the amplifier.

* * * * *